United States Patent
Miyanishi et al.

(10) Patent No.: US 8,957,720 B2
(45) Date of Patent: Feb. 17, 2015

(54) SAMPLING CLOCK GENERATOR CIRCUIT, AND IMAGE READER AND ELECTRONIC DEVICE INCORPORATING THE SAME

(75) Inventors: Isamu Miyanishi, Ikeda (JP); Tohru Kanno, Kawasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/004,202

(22) PCT Filed: Mar. 14, 2012

(86) PCT No.: PCT/JP2012/057245
§ 371 (c)(1),
(2), (4) Date: Sep. 10, 2013

(87) PCT Pub. No.: WO2012/124819
PCT Pub. Date: Sep. 20, 2012

(65) Prior Publication Data
US 2014/0002170 A1    Jan. 2, 2014

(30) Foreign Application Priority Data
Mar. 15, 2011 (JP) ................................. 2011-056726

(51) Int. Cl.
| | |
|---|---|
| H03K 3/00 | (2006.01) |
| H04N 1/047 | (2006.01) |
| H03K 5/135 | (2006.01) |
| H04N 1/19 | (2006.01) |

(52) U.S. Cl.
CPC ...... *H03K 5/135* (2013.01); *H04N 2201/04786* (2013.01); *H04N 1/047* (2013.01); *H04N 1/19* (2013.01)

USPC .......................................................... 327/299

(58) Field of Classification Search
USPC .......................................................... 327/291
See application file for complete search history.

(56) References Cited

U.S. PATENT DOCUMENTS 6,259,467 B1    7/2001    Hanna
(Continued)

FOREIGN PATENT DOCUMENTS

| | | |
|---|---|---|
| EP | 0793381 A2 | 9/1997 |
| JP | 2005-151296 | 6/2005 |

(Continued)

OTHER PUBLICATIONS

International Search Report issued May 1, 2012 in PCT/JP2012/057245 filed Mar. 14, 2012.

*Primary Examiner* — Daniel Rojas
(74) *Attorney, Agent, or Firm* — Cooper & Dunham LLP

(57) ABSTRACT

A sampling clock generator circuit includes a reference clock generator, a sampling hold circuit, a sampling clock generator to delay an output clock signal from the reference clock generator by a predetermined delay amount to generate and supply a sampling clock signal to the sampling hold circuit, a phase determining element to compare phases of a drive clock signal for an image reading unit and the sampling clock signal to output a result of the phase comparison, the drive clock signal generated according to the output clock signal of the reference clock generator, and a controller to adjust the delay amount of the sampling clock generator on the basis of the result of the phase comparison so that a phase difference between the drive clock signal and the sampling clock signal becomes zero.

7 Claims, 2 Drawing Sheets

(56) References Cited

U.S. PATENT DOCUMENTS

| | | | |
|---|---|---|---|
| 6,417,715 B2 * | 7/2002 | Hamamoto et al. | 327/291 |
| 2001/0052808 A1 | 12/2001 | Hamamoto et al. | |
| 2004/0186939 A1 | 9/2004 | Miyanishi et al. | |
| 2011/0043262 A1 | 2/2011 | Watanabe | |

FOREIGN PATENT DOCUMENTS

| | | |
|---|---|---|
| JP | 2009-081840 | 4/2009 |
| JP | 2010-021800 | 1/2010 |
| JP | 2010-062902 | 3/2010 |

* cited by examiner

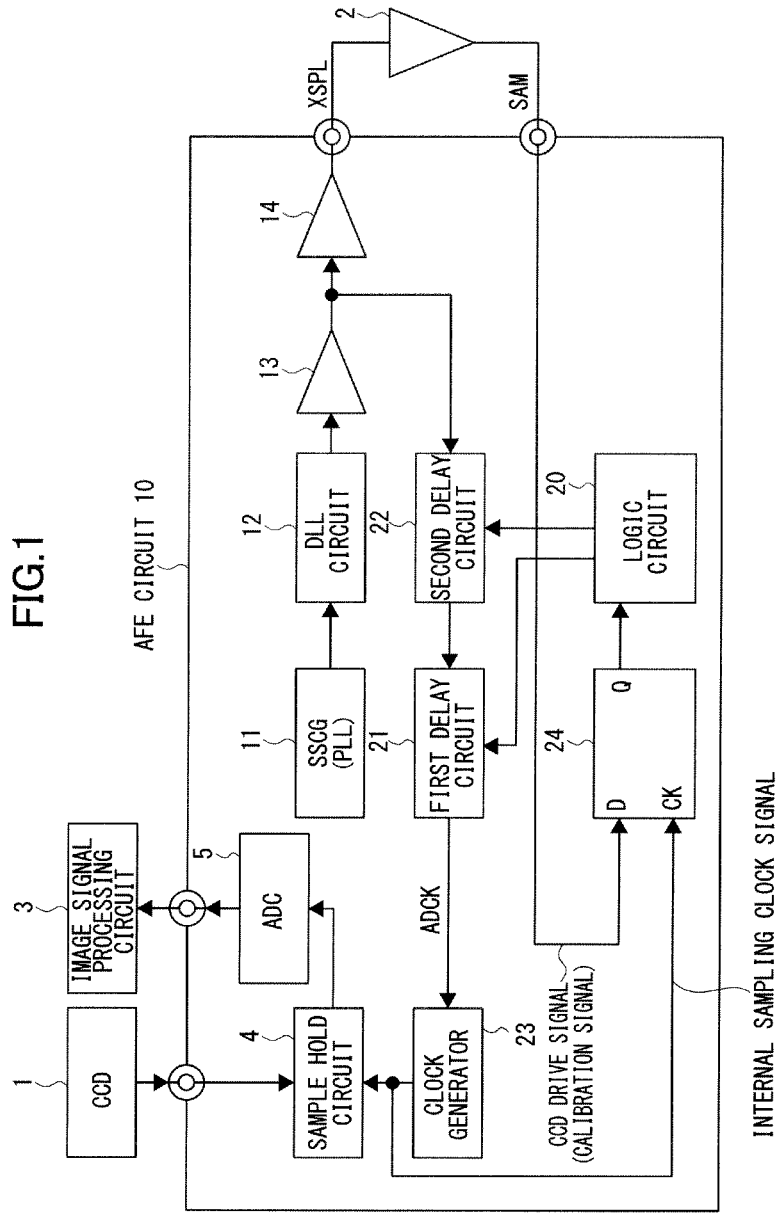

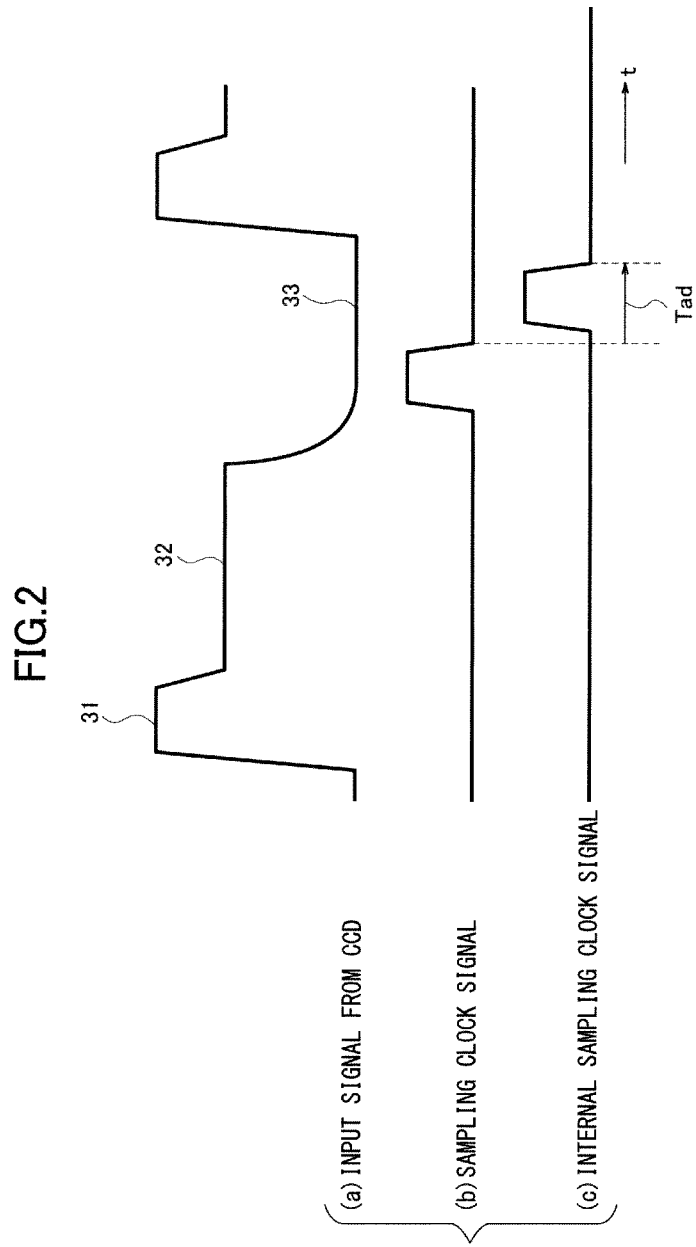

SAMPLING CLOCK GENERATOR CIRCUIT, AND IMAGE READER AND ELECTRONIC DEVICE INCORPORATING THE SAME

CROSS REFERENCE TO RELATED APPLICATION

The present application is based on and claims priority from Japanese Patent Application No. 2011-056726, filed on Mar. 15, 2011, the disclosure of which is hereby incorporated by reference in its entirety.

TECHNICAL FIELD

The present invention relates to a sampling clock generator circuit having an aperture delay calibration function for an imaging device such as a digital camera or a copier, an image reader incorporating the sampling clock generator circuit, and an electronic device incorporating the image reader.

BACKGROUND ART

Various drive pulses are required to drive a solid image sensor such as CCD (Charge Coupled Device) or CMOS (Complementary Metal-Oxide Semiconductor). To generate good image signals, it is necessary to generate the drive pulses in phases in a certain relation. This holds true for sampling process to prevent noise in image signals. Noise cannot be reduced properly unless sampling pulses are adjusted in phase in a certain relation (disclosed in Japanese Patent Application Publication No. 2009-081840 (Reference 1) and No. 2010-062902, for example).

Reference 1 discloses for example a technique to properly adjust CCD drive pulses and sampling pulses for correlated double sampling in phase by opening a lens or elongating the read interval of a CCD to attain sufficient exposure time so that CCD output reaches a defined saturation level. An automatic gain controller is set to make the CCD saturation output be the full scale of AD conversion, and the ideal phase relation of horizontal drive pulses are calculated to set an a phase adjusting circuit. A range in which signals are output from the CCD is determined by separately scanning sampling pulses SHP/SHD in the initial state to store a maximum output point.

Meanwhile, aperture delay is a problem in driving a CCD in an image reader. FIG. 2 is a timing chart for general aperture delay. Aperture delay refers to time Tad from when a sampling edge is supplied to an analog front end circuit (hereinafter, AFE circuit) to when a sample of an input signal is actually held. As shown in FIG. 2, the level of an input signal from the CCD is broadly divided to three levels, a reset level 31, a pedestal (black) level 32, and an image signal level 33. The AFE circuit samples and AD converts the input signal in the image level 33 for output.

To increase dynamic range and reduce jitters, it is preferable to sample the signal in a stable area of the image level close to the reset level.

However, while the CCD processes at high speed, this stable area is narrowed so that it is difficult to sample the signal in a stable image level with a large aperture delay with a fluctuation in power supply voltage, temperature, and process fluctuates taken into account.

SUMMARY OF INVENTION

The present invention aims to provide a sampling clock generator circuit with aperture delay calibration function to reduce aperture delay, an image reader incorporating such a sampling clock generator circuit, and an electronic device incorporating such an image reader.

According to one aspect of the present invention, a sampling clock generator circuit includes a reference clock generator, a sampling hold circuit, a sampling clock generator configured to delay an output clock signal from the reference clock generator by a predetermined delay amount to generate and supply a sampling clock signal to the sampling hold circuit, a phase determining element configured to compare phases of a drive clock signal for an image reading unit and the sampling clock signal to output a result of the phase comparison, the drive clock signal generated according to the output clock signal of the reference clock generator, and a controller configured to adjust the delay amount of the sampling clock generator on the basis of the result of the phase comparison so that a phase difference between the drive clock signal and the sampling clock signal becomes zero.

BRIEF DESCRIPTION OF THE DRAWINGS

Features, embodiments, and advantages of the present invention will become apparent from the following detailed description with reference to the accompanying drawings:

FIG. 1 shows the circuit configuration of an image reader incorporating an AFE circuit 10 according to one embodiment of the present invention; and FIG. 2 is a timing chart for general aperture delay.

DESCRIPTION OF EMBODIMENTS

Hereinafter, an embodiment of the present invention will be described in detail with reference to the accompanying drawings. Wherever possible, the same reference numbers will be used throughout the drawings to refer to the same or like parts.

FIG. 1 is a circuit diagram of an image reader including an AFE circuit 10 according to one embodiment of the present invention by way of example. The AFE circuit 10 is comprised of a single semiconductor integrated circuit with an aperture delay calibration function to reduce aperture delay.

In FIG. 1 an RGB signal is input to a sample hold circuit 4 from a CCD 1 of an image reading unit, the sample hold circuit 4 samples the signal in accordance with a clock supplied from a clock generator 23, and an AD converter 5 AD-converts the sampled signal to a LVDS signal, for example, and outputs it to an image signal processing circuit 3. A spread spectrum clock generator (hereinafter, SSCG) 11 as a reference clock generator is made up of a phase locked-loop circuit (hereinafter, PLL circuit) to generate a predetermined spread spectrum clock and output it to a DLL (delay locked-loop) circuit 12. The DLL circuit 12 is comprised of delay circuits in stages to generate different delay clocks in accordance with input clocks and output them as an XSPL signal being a CCD drive clock to an external driver circuit 2 via buffers 13, 14. The SSCG 11 can be a PLL circuit having an SSGC to generate and output general PLL clocks by turning off the SSGC function. Clocks output from the buffer 13 are supplied to the clock generator 23 as a reference clock ADCK via a second delay circuit 22 and a first delay circuit 21. The first delay circuit 21 coarsely adjusts delay time while the second delay circuit 22 finely adjusts delay time. The clock generator 23 generates a predetermined clock in accordance with the reference clock ADCK and outputs it to the sample hold circuit 4 and a clock terminal of a delay flip flop 24. Meanwhile, the XSPL signal is amplified and frequency-divided by the driver circuit 2, returned to an SAM terminal, and then input to the delay flip flop 24. Receiving the clock signal to the SAM terminal, the delay flip flop 24 latches it at a clock supply timing of the clock generator 23 and outputs it to a control logic circuit 20. The control logic circuit 20 is configured to control the delay amounts of the first and second delay circuits 21, 22 in accordance with input signals to adjust aperture delay, as described later. Herein, the first delay circuit 21 operates by current controlling a delay cell in the DLL circuit 12 and delays an input signal as the DLL circuit 12 does. The second delay circuit 22 is to finely adjust the delay by finely dividing the current.

To be able to sample an image signal input to the sample hold circuit 4 at a timing at which the clock signal is supplied to the SAM terminal, the AFE circuit 10 as configured above generates, on the basis of an internal PLL clock of the AFE circuit 10, an actual internal sampling clock signal which is generated by the clock generator 23 via the SSCG 11 and circuits 12, 13, 22, 21 and generates a CCD drive signal as a calibration signal from the XSPL signal input via the external driver 2 and SAM terminal.

Using the output signal of the SSCG 11 as a reference signal, the DLL circuit 12 generates a clock signal with a pixel clock cycle divided by 56 taps and generates the CCD drive signal, XSPL signal, and internal sampling clock signal.

According to aperture delay calibration, the delay flip flop 24 and the control logic circuit 20 measures a phase difference between the internal sampling clock signal and the CCD drive signal input to the SAM terminal. Then, the first delay circuit 21 coarsely adjusts a delay amount of the internal sampling clock signal in unit of tap delay td1 by scanning the taps from the zeroth tap so that the phase difference approaches zero as much as possible. For example, the pixel clock cycle is divided for 56 taps to adjust a delay amount by the unit of tap delay td1 by tap selection. Then, the second delay circuit 22 has taps to divide each tap of the first delay circuit 21 into 16, for example, to finely adjust a delay amount in a unit of tap delay td2 (<td1) by tap selection and scanning the taps from the zeroth tap so that the phase difference practically becomes zero. Thereby, the second delay circuit 22 can adjust the clock timing for the CCD drive signal input to the SAM terminal and for the internal sampling clock signal used in the sample hold circuit 4 to coincide with each other in unit of tap. Thus, the aperture delay is reduced.

To calibrate aperture delay in the internal sampling clock signal by scanning the taps of the first and second delay circuits 21, 22, it is necessary to set a delay amount of the clock signal form the output terminal of the buffer 13 to the SAM terminal to be larger than that of the internal sampling clock signal of the clock generator 23 from the clock signal from the output terminal of the buffer 13. Further, to measure a phase difference between the internal sampling clock signal and the CCD drive signal with a minimum error, a delay amount of the clock signal from the SAM terminal to the input terminal of the delay flip flop 24 has to coincide with that of the internal sampling clock signal from the clock generator 23 to the delay flip flop 24.

As described above, the sampling clock generator circuit as the AFE circuit 10 includes the sampling clock generator comprised of the first and second delay circuits 21, 22 and the clock generator 23 to delay a clock signal output from the SSCG 11 by a predetermined delay amount to generate and supply the sampling clock signal to the sampling hold circuit 4, the delay flip flop 24 to compare the phases of the CCD drive clock signal generated according to the output clock signal and the sampling clock signal to output a comparison result, and the control logic circuit 20 to control the delay amount of the sampling clock generator on the basis of the comparison result so that a phase difference between the drive clock signal and the sampling clock signal becomes zero. Accordingly, aperture delay can be reduced.

The image reader can be incorporated into an electronic device such as a digital camera, a mobile phone, a multifunction machine.

Although the present invention has been described in terms of exemplary embodiments, it is not limited thereto. It should be appreciated that variations or modifications may be made in the embodiments described by persons skilled in the art without departing from the scope of the present invention as defined by the following claims.

The invention claimed is:

1. A sampling clock generator comprising:
a reference clock generator;
a sampling hold circuit;
a sampling clock generator configured to delay an output clock signal from the reference clock generator by a predetermined delay amount to generate and supply a sampling clock signal to the sampling hold circuit;
a phase determining element configured to compare phases of a drive clock signal for an image reading unit and the sampling clock signal to output a result of the phase comparison, the drive clock signal generated according to the output clock signal of the reference clock generator;
a controller configured to adjust the delay amount of the sampling clock generator on the basis of the result of the phase comparison so that a phase difference between the drive clock signal and the sampling clock signal becomes zero;
a first delay circuit having a plurality of first delay taps to delay the output clock signal input by a tap selection; and
a second delay circuit having a plurality of second delay taps having a delay amount smaller than that of the first delay taps to delay the output clock signal input by a tap selection,
wherein the controller is configured to coarsely adjust the delay amount of the sampling clock generator on the basis of the result of the phase comparison by the tap selection of the first delay circuit and then finely adjust the delay amount by the tap selection of the second delay circuit so that a phase difference between the drive clock signal and the sampling clock signal becomes zero.

2. The sampling clock generator according to claim 1, wherein the clock signal generated and output by the reference clock generator is a predetermined spread spectrum clock signal.

3. An image reader comprising an image reading unit and a sampling clock generator circuit to supply a clock signal to the image reading unit, wherein the sampling clock generator circuit comprises:
a reference clock generator;
a sampling hold circuit;
a sampling clock generator configured to delay an output clock signal from the reference clock generator by a predetermined delay amount to generate and supply a sampling clock signal to the sampling hold circuit;
a phase determining element configured to compare phases of a drive clock signal for an image reading unit and the sampling clock signal to output a result of the phase comparison, the drive clock signal generated according to the output clock signal of the reference clock generator;
a controller configured to adjust the delay amount of the sampling clock generator on the basis of the result of the phase comparison so that a phase difference between the drive clock signal and the sampling clock signal becomes zero;

a first delay circuit having a plurality of first delay taps to delay the output clock signal input by a tap selection; and a second delay circuit having a plurality of second delay taps having a delay amount smaller than that of the first delay taps to delay the output clock signal input by a tap selection, wherein the controller is configured to coarsely adjust the delay amount of the sampling clock generator on the basis of the result of the phase comparison by the tap selection of the first delay circuit and then finely adjust the delay amount by the tap selection of the second delay circuit so that a phase difference between the drive clock signal and the sampling clock signal becomes zero.

4. An electronic device comprising the image reader according to claim 3.

5. The image reader according to claim 3, wherein the clock signal generated and output by the reference clock generator is a predetermined spread spectrum clock signal.

6. The image reader according to claim 3, wherein the image reading unit outputs an image signal, and the sampling hold circuit samples the image signal at a timing corresponding to the sampling clock signal and outputs a sampled signal.

7. The image reader according to claim 3, wherein the sampled signal is returned to the image reading unit.

* * * * *